(12) United States Patent
Chuang et al.

(10) Patent No.: US 11,563,157 B2
(45) Date of Patent: Jan. 24, 2023

(54) LIGHT-EMITTING DEVICE

(71) Applicant: Au Optronics Corporation, Hsinchu (TW)

(72) Inventors: Hui-Yang Chuang, Hsinchu (TW); Chin-Yuan Ho, Hsinchu (TW); Tsung-Tien Wu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 136 days.

(21) Appl. No.: 17/033,688

(22) Filed: Sep. 26, 2020

(65) Prior Publication Data

US 2021/0391517 A1 Dec. 16, 2021

(30) Foreign Application Priority Data

Jun. 10, 2020 (TW) ................................. 109119488

(51) Int. Cl.
*H01L 33/62* (2010.01)
*H01L 23/00* (2006.01)
*H01L 25/075* (2006.01)
*H01L 33/38* (2010.01)
*H01L 25/16* (2006.01)

(52) U.S. Cl.
CPC .............. *H01L 33/62* (2013.01); *H01L 24/16* (2013.01); *H01L 24/32* (2013.01); *H01L 24/33* (2013.01); *H01L 24/73* (2013.01); *H01L 25/0753* (2013.01); *H01L 25/167* (2013.01); *H01L 33/38* (2013.01); *H01L 2224/16237* (2013.01); *H01L 2224/32225* (2013.01); *H01L 2224/33505* (2013.01); *H01L 2224/73203* (2013.01)

(58) Field of Classification Search
None
See application file for complete search history.

(56) References Cited

U.S. PATENT DOCUMENTS

| 8,247,833 | B2 | 8/2012 | Shen et al. |
| 9,111,464 | B2 | 8/2015 | Bibl et al. |
| 9,599,857 | B2 | 3/2017 | Bibl et al. |
| 9,865,577 | B2 | 1/2018 | Bibl et al. |
| 10,446,729 | B1 | 10/2019 | Chen et al. |

(Continued)

FOREIGN PATENT DOCUMENTS

| CN | 1499589 | 5/2004 |
| CN | 102237470 | 11/2011 |

(Continued)

*Primary Examiner* — Telly D Green
(74) *Attorney, Agent, or Firm* — JCIPRNET

(57) ABSTRACT

A light-emitting device, including a circuit substrate, a first light-emitting diode, and a first fixing structure, is provided. The circuit substrate includes a substrate, a first pad, a flat layer, and a first electrical connection material. The first pad and the flat layer are located on the substrate. The flat layer has a first opening overlapping the first pad. The first electrical connection material is located in the first opening and is electrically connected to the first pad. The first light-emitting diode is located on the flat layer and in contact with the first electrical connection material. The first fixing structure is located between the first light-emitting diode and the flat layer. The vertical projection of the first fixing structure on the substrate is located in the vertical projection of the first light-emitting diode on the substrate.

15 Claims, 7 Drawing Sheets

(56) References Cited

U.S. PATENT DOCUMENTS

| | | | |
|---|---|---|---|
| 10,522,712 B2 * | 12/2019 | Lai | ............ H01L 33/385 |
| 11,355,550 B2 * | 6/2022 | Chen | ............ H01L 33/483 |
| 2011/0266586 A1 | 11/2011 | Shen et al. | |
| 2014/0367633 A1 | 12/2014 | Bibl et al. | |
| 2015/0331285 A1 | 11/2015 | Bibl et al. | |
| 2017/0162553 A1 | 6/2017 | Bibl et al. | |
| 2018/0351042 A1 | 12/2018 | Jang et al. | |
| 2019/0006559 A1 * | 1/2019 | Lai | ............ H01L 27/1214 |
| 2020/0075805 A1 * | 3/2020 | Lai | ............ H01L 33/22 |
| 2020/0098964 A1 * | 3/2020 | Hashimoto | ............ H01L 33/50 |
| 2020/0194406 A1 * | 6/2020 | Liu | ............ H01L 25/0753 |
| 2021/0391517 A1 * | 12/2021 | Chuang | ............ H01L 24/16 |

FOREIGN PATENT DOCUMENTS

| | | | |
|---|---|---|---|
| CN | 109887950 | | 6/2019 |
| CN | 109887950 A | * | 6/2019 |
| CN | 110190170 | | 8/2019 |
| KR | 101248513 | | 4/2013 |
| TW | 201515260 | | 4/2015 |

\* cited by examiner

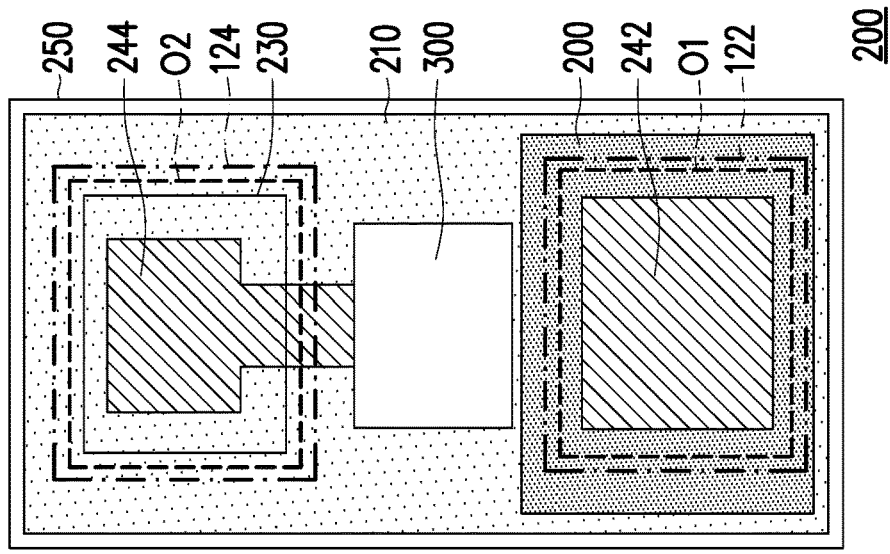
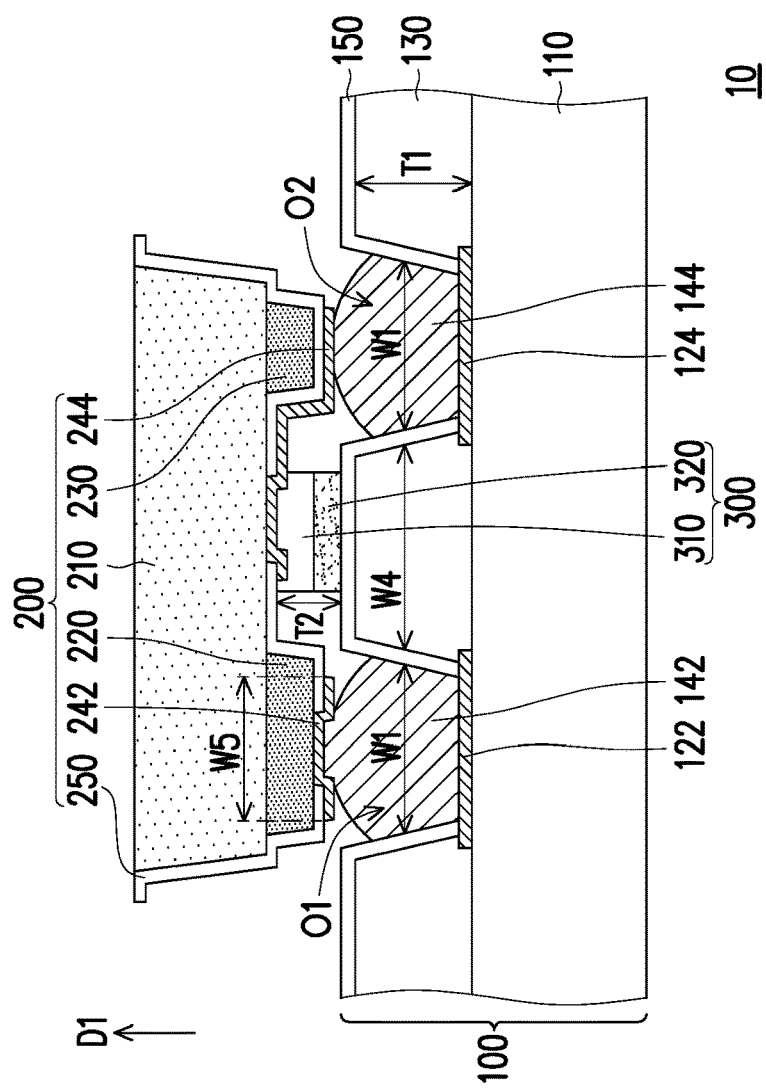
FIG. 1B
FIG. 1A

LIGHT-EMITTING DEVICE

CROSS-REFERENCE TO RELATED APPLICATION

This application claims the priority benefit of Taiwan application serial no. 109119488, filed on Jun. 10, 2020. The entirety of the abovementioned patent application is hereby incorporated by reference herein and made a part of this specification.

BACKGROUND

Technical Field

This disclosure relates to a light-emitting device, and in particular to a light-emitting device having a light-emitting diode.

Description of Related Art

A light-emitting diode (LED) is a light-emitting element with characteristics such as low power consumption, high brightness, high resolution, and high color saturation. Therefore, it is suitable for constructing a pixel structure of a light-emitting diode display panel.

The technology of transporting the light-emitting diode to a driving substrate with a pixel circuit is called mass transfer. When the light-emitting diode is being transferred in the conventional art, an issue of incorrect transposition of the light-emitting diode is prone to occur, which causes some pixels in the display device failing to operate normally, and seriously affecting the display quality of the display device.

SUMMARY

The disclosure provides a light-emitting device capable of facilitating yield in a transfer process.

A light-emitting device of the disclosure includes a circuit substrate, a first light-emitting diode, and a first fixing structure. The circuit substrate includes a substrate, a first pad, a flat layer, and a first electrical connection material. The first pad and the flat layer are located on the substrate. The flat layer has a first opening overlapping the first pad. The first electrical connection material is located in the first opening, and is electrically connected to the first pad. The first light-emitting diode is located on the flat layer, and in contact with the first electrical connection material. The first fixing structure is located between the first light-emitting diode and the flat layer. A vertical projection of the first fixing structure on the substrate is located in a vertical projection of the first light-emitting diode on the substrate.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1A is a schematic cross-sectional view of a light-emitting device according to an embodiment of the disclosure.

FIG. 1B is a schematic bottom view of the light-emitting device in FIG. 1A.

DESCRIPTION OF THE EMBODIMENTS

Figure 2:
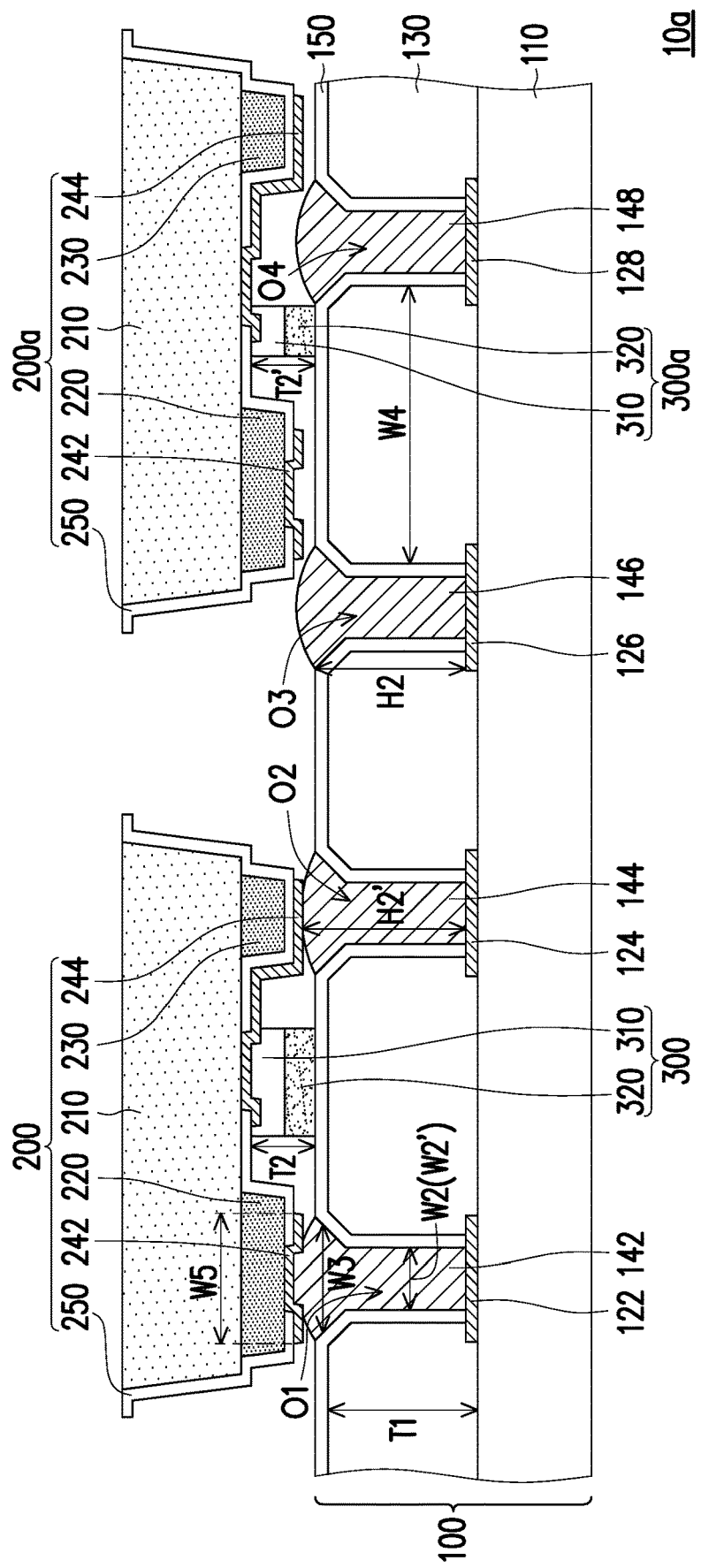
FIG. 2 is a schematic cross-sectional view of a light-emitting device according to an embodiment of the disclosure.

FIG. 1A is a schematic cross-sectional view of a light-emitting device according to an embodiment of the disclosure. FIG. 1B is a schematic bottom view of the light-emitting device in FIG. 1A.

With reference to FIGS. 1A and 1B, a light-emitting device 10 includes a circuit substrate 100, a first light-emitting diode 200, and a first fixing structure 300.

The circuit substrate 100 includes a substrate 110, a first pad 122, a flat layer 130, and a first electrical connection material 142. In the embodiment, the circuit substrate 100 further includes a second pad 124, a second electrical connection material 144, and a protective layer 150.

The first pad 122 and the second pad 124 are located on the substrate 110. In some embodiments, one of the first pad 122 and the second pad 124 is electrically connected to a thin film transistor, while the other is electrically connected to a common signal line, but the disclosure is not limited thereto. The materials of the first pad 122 and the second pad 124 include metal, metal oxide, metal nitride or other conductive materials.

The flat layer 130 is located on the substrate 110. In some embodiments, the material of the flat layer 130 includes photoresist or other suitable materials. The flat layer 130 has a first opening O1 overlapping the first pad 122, and a second opening O2 overlapping the second pad 124. The protective layer 150 is located on a surface of the flat layer 130 and covers sidewalls of the first opening O1 and the second opening O2. In some embodiments, the material of the protective layer 150 includes silicon nitride, silicon oxide or other suitable materials. In some embodiments, the protective layer 150 is suitable for protecting the flat layer 130 during the process of patterning the first fixing structure 300. In the embodiment, the first opening O1 and the second opening O2 have a width W1, and the width W1 is, for example, 1 micrometer (μm) to 20 μm. In the embodiment, a width W4 of the flat layer 130 between the first opening O1 and the second opening O2 is 1 μm to 60 μm, and a thickness T1 of the flat layer 130 is 1 μm to 4 μm.

The first electrical connection material 142 is located in the first opening O1, and is electrically connected to the first pad 122. The second electrical connection material 144 is located in the second opening O2, and is electrically connected to the second pad 124. In the embodiment, the materials of the first electrical connection material 142 and the second electrical connection material 144 include solder, conductive paste or other suitable materials.

The first light-emitting diode 200 is located on the flat layer 130 and is in contact with the first electrical connection material 142 and the second electrical connection material 144. In the embodiment, the first light-emitting diode 200 is a horizontal light-emitting diode and includes a first semiconductor layer 210, a second semiconductor layer 220, a third semiconductor layer 230, a first electrode 242, a second electrode 244, and an insulation layer 250. The second semiconductor layer 220 overlaps the first semiconductor layer 210. The first electrode 242 is located on the second semiconductor layer 220, and is electrically connected to the second semiconductor layer 220 through an opening of the insulation layer 250 located on the second semiconductor layer 220. The third semiconductor layer 230 overlaps the first semiconductor layer 210. The second electrode 244 is located on the third semiconductor layer 230 and is electrically connected to the first semiconductor layer 210 through an opening of the insulation layer 250 located between the second semiconductor layer 220 and the third semiconductor layer 230. In the embodiment, the thickness of the second semiconductor layer 220 is approximately equal to the thickness of the third semiconductor layer 230, thereby reducing the height difference between the first electrode 242 and the second electrode 244. The insulation layer 250 partially covers the first semiconductor layer 210, the second semiconductor layer 220, and the third semiconductor layer 230.

In some embodiments, the material of the first semiconductor layer 210 includes an N-type semiconductor material, and the materials of the third semiconductor layer 230 and the second semiconductor layer 220 include a P-type semiconductor material. In some embodiments, the materials of the first electrode 242 and the second electrode 244 include gold, silver, copper or other metallic materials. In some embodiments, the light-emitting area of the first light-emitting diode 200 is limited by the overlapping area of the first semiconductor layer 210 and the second semiconductor layer 220. Therefore, increasing the area of the second semiconductor layer 220 helps to increase the light-emitting area of the first light-emitting diode 200. In some embodiments, the area of the second semiconductor layer 220 is larger than the area of the third semiconductor layer 230. In the embodiment, a width W5 of the first electrode 242 is 1 µm to 20 µm.

In the embodiment, the first light-emitting diode 200 is bonded to the circuit substrate 100 in a flip chip manner. The first electrode 242 and the second electrode 244 are respectively electrically connected to the first electrical connection material 142 and the second electrical connection material 144. In the embodiment, the first electrode 242 overlaps the first opening O1 in a direction D1 vertical to the substrate 110, and the second electrode 244 overlaps the second opening O2 in the direction D1 vertical to the substrate 110, thereby minimizing the area of a single subpixel.

The first fixing structure 300 is located between the first light-emitting diode 200 and the flat layer 130. The vertical projection of the first fixing structure 300 on the substrate 110 is located in the vertical projection of the first light-emitting diode 200 on the substrate 110. In the embodiment, the position of the vertical projection of a part of the first fixing structure 300 on the substrate 110 is located between the position of the vertical projection of the first electrode 242 on the substrate 110, and the position of the vertical projection of the second electrode 244 on the substrate 110, which decreases the probability of the first electrode 242 and the second electrode 244 short-circuiting. In the embodiment, the position of the vertical projection of the first fixing structure 300 on the substrate 110 is located between the position of the vertical projection of the second semiconductor layer 220 on the substrate 110, and the position of the vertical projection of the third semiconductor layer 230 on the substrate 110. In some embodiments, both sides of the first fixing structure 300 are respectively in contact with the first light-emitting diode 200 and the circuit substrate 100. The first fixing structure 300 does not overlap (or does not completely overlap) the first electrical connection material 142 and the second electrical connection material 144 in the direction D1 vertical to the substrate 110. Consequently, the probability of conduction between the first light-emitting diode 200 and the circuit substrate 100 is increased.

The first fixing structure 300 is a single-layer or a multi-layer structure. In the embodiment, the first fixing structure 300 includes a first layer 310, and a second layer 320 overlapping the first layer 310. The material of the first layer 310 is different from the material of the second layer 320. In some embodiments, at least one of the first layer 310 and the second layer 320 is a photoresist layer or a silicon oxide layer with a thickness of less than 1 µm. In the embodiment, the first layer 310 is an adhesive glue, and the second layer 320 is a photoresist layer or a silicon oxide layer with a thickness of less than 1 µm. The second layer 320 may well adjust a height position of the first layer 310. In some embodiments, a thickness T2 of the first fixing structure 300 is 0.7 µm to 4 µm. The thickness and the material of the first fixing structure 300 affect the amount of compression and the supporting force of the first fixing structure 300 during a hot pressing process. When the second layer 320 is a photoresist layer or a silicon oxide layer with a thickness of less than 1 µm, the first fixing structure 300 may have a good supporting force.

The first fixing structure 300 helps in positioning of the first light-emitting diode 200, so that the first light-emitting diode 200 can come into contact with the first electrical connection material 142 and the second electrical connection material 144 even without the hot pressing process. In addition, the first fixing structure 300 can reduce the issue of different light-emitting diodes being unevenly pressurized during the hot pressing process.

FIG. 2 is a schematic cross-sectional view of a light-emitting device according to an embodiment of the disclosure. It is noted that the embodiment in FIG. 2 incorporates the reference numerals/symbols and part of the content of the embodiment in FIGS. 1A and 1B. The same or similar reference symbols are used to represent the same or similar elements, and description of the same technical content is omitted. Reference is drawn to the foregoing embodiment for the description of the omitted part, and the same content will not be repeated in the following.

With reference to FIG. 2, in the embodiment, the circuit substrate 100 of a light-emitting device 10a further includes a third pad 126, a fourth pad 128, a third electrical connection material 146, and a fourth electrical connection material 148. The third pad 126 and the fourth pad 128 are located on the substrate 110. The flat layer 130 has a third opening O3 overlapping the third pad 126, and a fourth opening O4 overlapping the fourth pad 128. The third electrical connection material 146 and the fourth electrical connection material 148 are respectively located in the third opening O3, and the fourth opening O4. The third electrical connection material 146 and the fourth electrical connection material 148 are respectively electrically connected to the third pad 126, and the fourth pad 128.

In the embodiment, the first light-emitting diode 200 and a second light-emitting diode 200a are transferred to the circuit substrate 100 through a transposition process (such as mass transfer). The second light-emitting diode 200a includes the first semiconductor layer 210, the second semiconductor layer 220, the third semiconductor layer 230, the first electrode 242, the second electrode 244, and the insulation layer 250. In the embodiment, the structure of the second light-emitting diode 200a is similar to the structure of the first light-emitting diode 200, and reference may be made to the embodiment in FIG. 1A for the related description, which is not reiterated here. In the embodiment, the first light-emitting diode 200 is aligned to a predetermined position after the transposition process, and the second light-emitting diode 200a is not aligned to the predetermined position after the transposition process. Therefore, the second light-emitting diode 200a is unable to electrically connect to the circuit substrate 100 correctly.

A second fixing structure 300a is located between the second light-emitting diode 200a and the circuit substrate 100. In the embodiment, both sides of the second fixing structure 300a are respectively in contact with the second light-emitting diode 200a and the circuit substrate 100.

In the embodiment, the first opening O1, the second opening O2, the third opening O3, and the fourth opening O4 have a width W2 near the substrate 110, and the width W2 is 1 µm to 20 µm. The first opening O1, the second opening O2, the third opening O3, and the fourth opening O4 have a width W3 away from the substrate 110, and the width W3 is greater than the width W2. The width W3 is, for example, 1 µm to 20 µm.

In the embodiment, the first electrical connection material 142, the second electrical connection material 144, the third electrical connection material 146, and the fourth electrical connection material 148 have a width W2' near the substrate 110. The first electrical connection material 142, the second electrical connection material 144, the third electrical connection material 146, and the fourth electrical connection material 148 also have a height H2'. The width W2' is 1 µm to 20 µm, and the height H2' is 1 µm to 4 µm. By reducing the width W2, the volume of the electrical connection material in the opening can be increased, and the height H2' of the electrical connection material can be increased, thereby elevating the process margin. In the embodiment, the height H2' is greater than a depth H2 of the first opening O1, the second opening O2, the third opening O3, and the fourth opening O4. In the embodiment, a width W4 of the flat layer 130 between the first opening O1 and the second opening O2 (or the flat layer 130 between the third opening O3 and the fourth opening O4) is 1 µm to 60 µm, and the thickness T1 of the flat layer 130 is 1 µm to 4 µm.

In the embodiment, a width W5 of the first electrode 242 is 1 µm to 20 µm.

In the embodiment, the thickness T2 of the first fixing structure 300 and a thickness T2' of the second fixing structure 300a are 0.7 µm to 4 µm. In some embodiments, the thickness T2 of the first fixing structure 300 and the thickness T2' of the second fixing structure 300a are the same or are different.

The width W2 of the opening of the embodiment is smaller than the width W1 of the opening of the embodiment in FIG. 1A. Therefore, the incorrectly aligned second light-emitting diode 200a is unable to come into contact with the third electrical connection material 146 in the third opening O3 and the fourth electrical connection material 148 in the fourth opening O4 easily. As a result, the first electrode 242 and the second electrode 244 of the second light-emitting diode 200a are prevented from being eutectic bonded to the third electrical connection material 146 and the fourth electrical connection material 148 after the hot pressing process. Therefore, the second light-emitting diode 200a can be lifted without removing the third electrical connection material 146 and the fourth electrical connection material 148, and the difficulty of a repair process is thereby reduced. In addition, since the composition of the third electrical connection material 146 and the fourth electrical connection material 148 is not changed after the hot pressing process, the third electrical connection material 146 and the fourth electrical connection material 148 may be eutectic bonded to a light-emitting diode for repair in the subsequent repair process. A new third electrical connection material 146 and a new fourth electrical connection material 148 are not required to be re-disposed.

Figure 3:
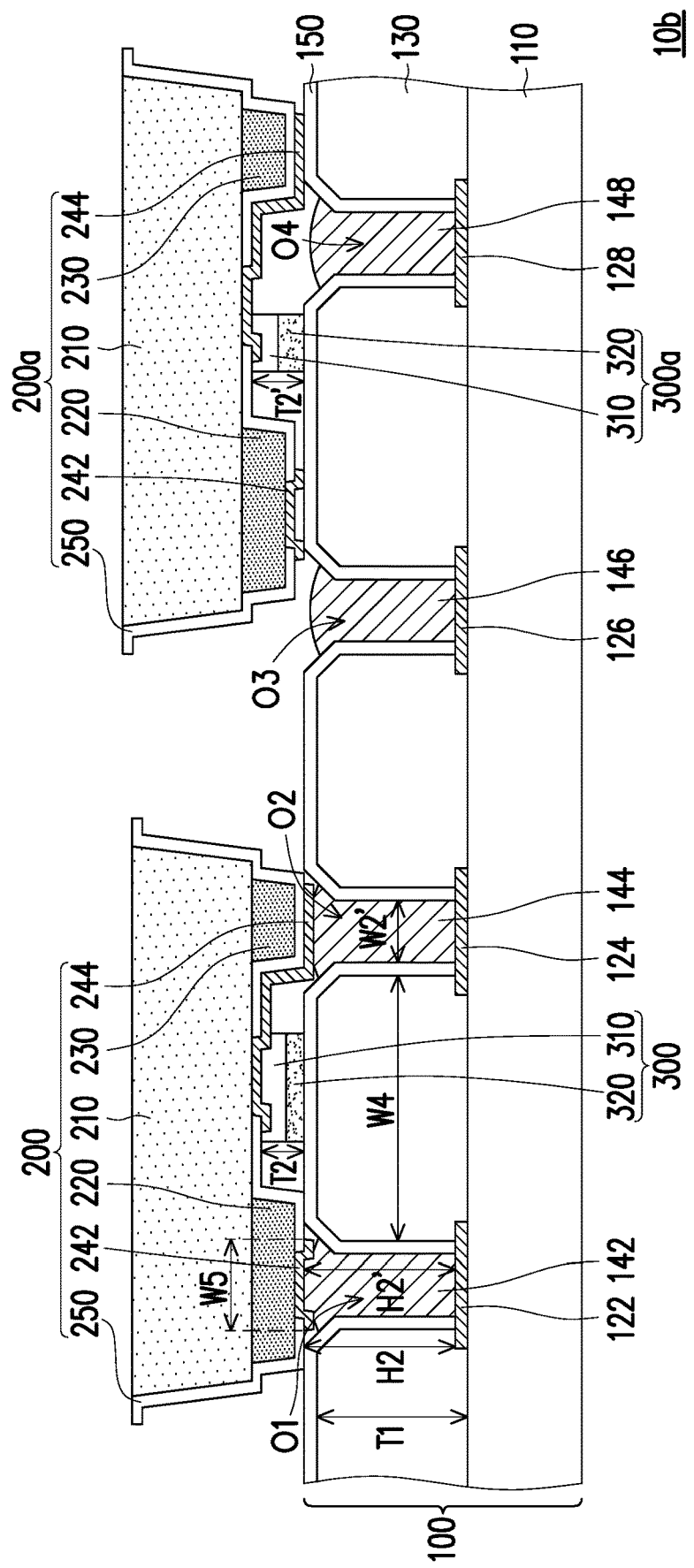
FIG. 3 is a schematic cross-sectional view of a light-emitting device according to an embodiment of the disclosure.

FIG. 3 is a schematic cross-sectional view of a light-emitting device according to an embodiment of the disclosure. It is noted that the embodiment in FIG. 3 incorporates the reference numerals/symbols and part of the content of the embodiment in FIG. 2. The same or similar reference numerals/symbols are used to represent the same or similar elements, and description of the same technical content is omitted. Reference is drawn the foregoing embodiments for the description of the omitted part, and the same content will not be repeated in the following.

With reference to FIG. 3, in a light-emitting device 10b, the first electrical connection material 142, the second electrical connection material 144, the third electrical connection material 146, and the fourth electrical connection material 148 have the width W2' near the substrate 110, and the first electrical connection material 142, the second electrical connection material 144, the third electrical connection material 146, and the fourth electrical connection material 148 have the height H2'. The width W2' is 1 µm to 20 µm, and the height H2' is 1 µm to 4 µm. In the embodiment, the height H2' is, for example, less than or equal to the depth H2 of the first opening O1, the second opening O2, the third opening O3, and the fourth opening O4. In the embodiment, the width W4 of the flat layer 130 between the first opening O1 and the second opening O2 (or the flat layer 130 between the third opening O3 and the fourth opening O4) is 1 µm to 60 µm, and the thickness T1 of the flat layer 130 is 1 µm to 4 µm.

In the embodiment, the width W5 of the first electrode 242 is 1 µm to 20 µm. In some embodiments, the light-emitting area of the first light-emitting diode 200 is limited by the overlapping area of the first semiconductor layer 210 and the second semiconductor layer 220. Therefore, increasing the area of the second semiconductor layer 220 helps to increase the light-emitting area of the first light-emitting diode 200. In some embodiments, the area of the second semiconductor layer 220 is larger than the area of the third semiconductor layer 230.

In the embodiment, the thickness T2 of the first fixing structure 300 and the thickness T2' of the second fixing structure 300a are 0.7 µm to 4 µm.

By matching the foregoing electrical connection material, the opening of the flat layer and the fixing structure with each other, the yield rate of a light-emitting device manufacturing process can be elevated, and the light-emitting diode can be prevented from falling off easily. In addition, in some embodiments, a light-emitting diode for repair may be electrically connected to the third pad 126 and the fourth pad 128, and there is no need to dispose additional pads and wirings for repair. Accordingly, the area of a single subpixel can be reduced.

Figure 4:
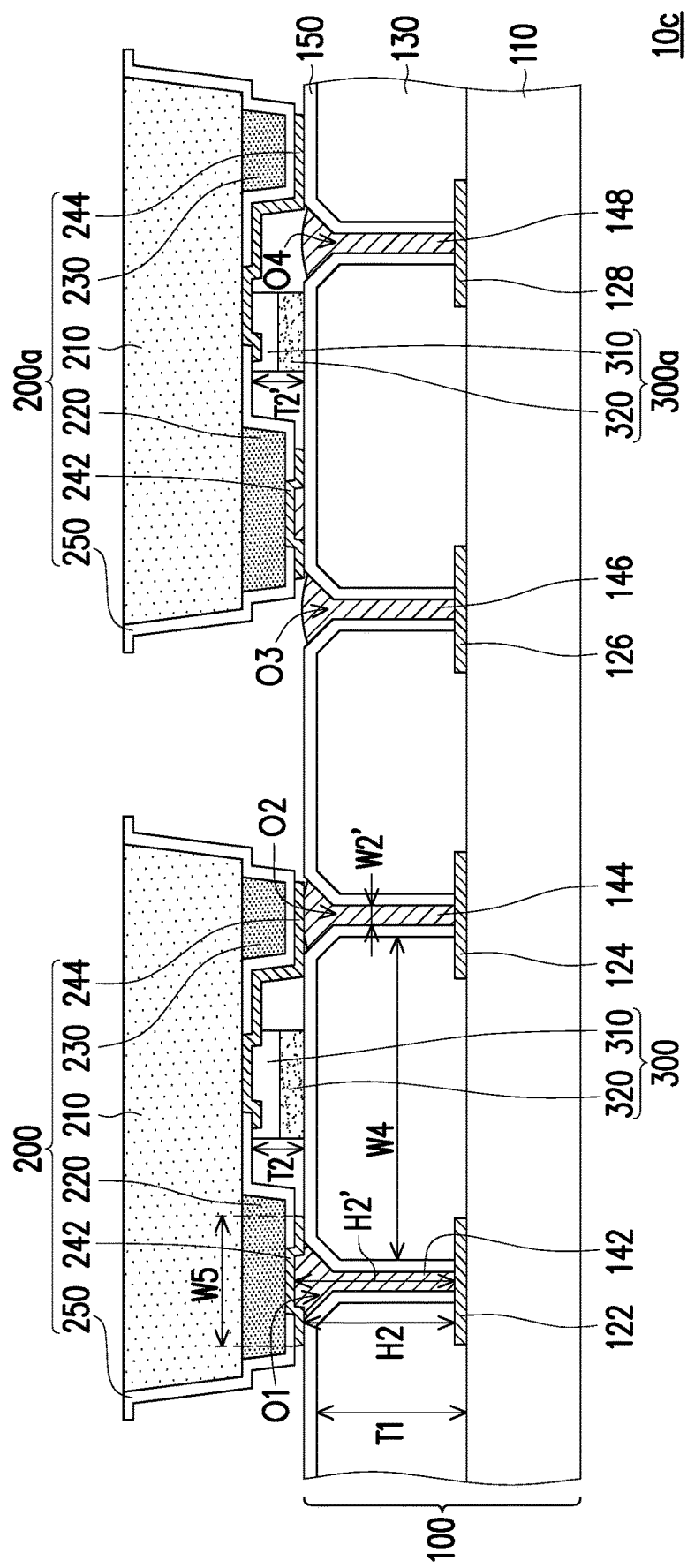
FIG. 4 is a schematic cross-sectional view of a light-emitting device according to an embodiment of the disclosure.

FIG. 4 is a schematic cross-sectional view of a light-emitting device according to an embodiment of the disclosure. It is noted that the embodiment in FIG. 4 incorporates the reference numerals/symbols and part of the content of the embodiment in FIG. 3. The same or similar reference numerals/symbols are used to represent the same or similar elements, and description of the same technical content is omitted. Reference is drawn the foregoing embodiments for the description of the omitted part, and the same content will not be repeated in the following.

With reference to FIG. 4, in a light-emitting device 10*c*, the width W2 of the first opening O1 and the second opening O2 near the substrate 110 is smaller than the corresponding width W5 of the first electrode 242 and the width of the second electrode 244, thereby increasing the height H2' of the electrical connection material. Accordingly, the contact area between the electrode and the electrical connection material can be larger.

Figure 5:
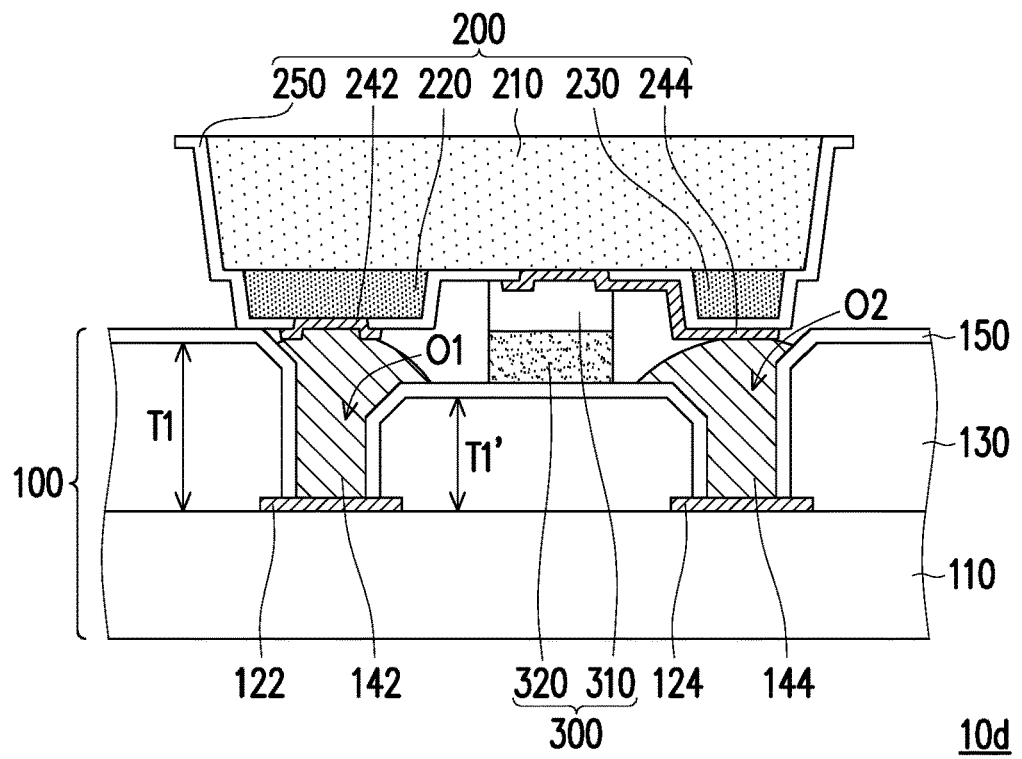
FIG. 5 is a schematic cross-sectional view of a light-emitting device according to an embodiment of the disclosure.

FIG. 5 is a schematic cross-sectional view of a light-emitting device according to an embodiment of the disclosure. It is noted that the embodiment in FIG. 5 incorporates the reference numerals/symbols and part of the content of the embodiment in FIG. 3. The same or similar reference numerals/symbols are used to represent the same or similar elements, and description of the same technical content is omitted. Reference is drawn the foregoing embodiments for the description of the omitted part, and the same content will not be repeated in the following.

With reference to FIG. 5, in a light-emitting device 10*d*, a thickness T1' of the flat layer 130 overlapping the first fixing structure 300 is smaller than the thickness T1 of the remaining flat layer 130. In some embodiments, the thickness T1 and the thickness T1' are 1 µm to 4 µm.

In the embodiment, the flat layer 130 between the first opening O1 and the second opening O2 has the thickness T1', and the flat layer 130 on outer sides of the first opening O1 and the second opening O2 has the thickness T1.

Figure 6:
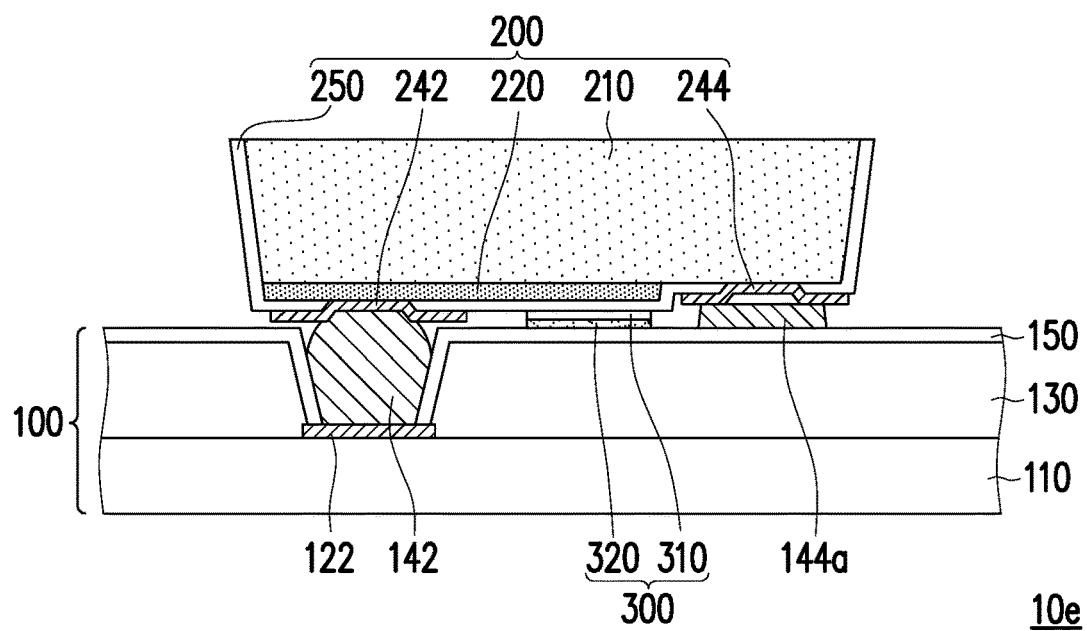
FIG. 6 is a schematic cross-sectional view of a light-emitting device according to an embodiment of the disclosure.

FIG. 6 is a schematic cross-sectional view of a light-emitting device according to an embodiment of the disclosure. It is noted that the embodiment in FIG. 6 incorporates the reference numerals/symbols and part of the content of the embodiment in FIG. 1A. The same or similar reference numerals/symbols are used to represent the same or similar elements, and description of the same technical content is omitted. Reference is drawn the foregoing embodiments for the description of the omitted part, and the same content will not be repeated in the following.

With reference to FIG. 6, in a light-emitting device 10*e*, the first light-emitting diode 200 is a horizontal light-emitting diode, and includes the first semiconductor layer 210, the second semiconductor layer 220, the first electrode 242, the second electrode 244, and the insulation layer 250. The second semiconductor layer 220 overlaps the first semiconductor layer 210. The first electrode 242 is located on the second semiconductor layer 220. The second electrode 244 is located on the first semiconductor layer 210. The insulation layer 250 partially covers the semiconductor layer 210 and the second semiconductor layer 220.

In the embodiment, the first light-emitting diode 200 is bonded to the circuit substrate 100 in a flip chip manner, the first electrode 242 and the second electrode 244 are respectively electrically connected to the first electrical connection material 142 and a second electrical connection material 144*a*. In the embodiment, the second electrical connection material 144*a* is not filled in the opening of the flat layer 130. The second electrical connection material 144*a* is, for example, electrically connected to a pad of the circuit substrate 100 through other wirings. In the embodiment, the volume of the second electrical connection material 144*a* is smaller than that of the first electrical connection material 142.

The first fixing structure 300 is located between the first light-emitting diode 200 and the flat layer 130. The vertical projection of the first fixing structure 300 on the substrate 110 is located in the vertical projection of the first light-emitting diode 200 on the substrate 110. In the embodiment, the first fixing structure 300 overlaps the second semiconductor layer 220.

Figure 7:
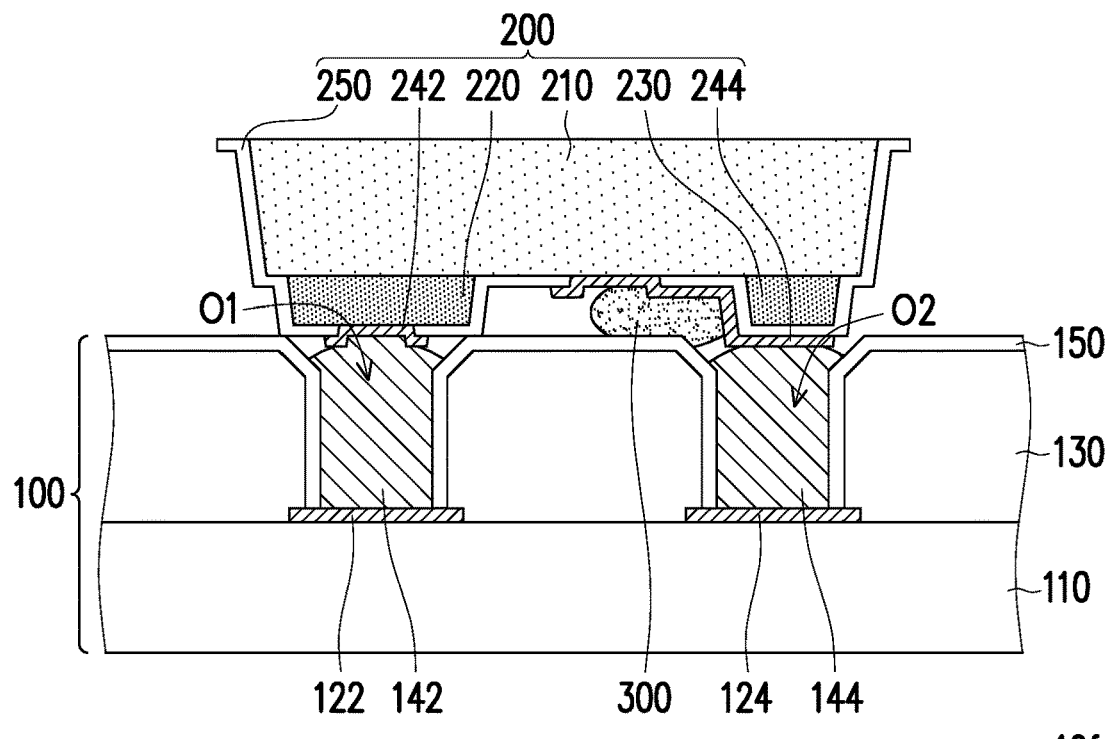
FIG. 7 is a schematic cross-sectional view of a light-emitting device according to an embodiment of the disclosure.

FIG. 7 is a schematic cross-sectional view of a light-emitting device according to an embodiment of the disclosure. It is noted that the embodiment in FIG. 7 incorporates the reference numerals/symbols and part of the content of the embodiment in FIG. 1A. The same or similar reference numerals/symbols are used to represent the same or similar elements, and description of the same technical content is omitted. Reference is drawn the foregoing embodiments for the description of the omitted part, and the same content will not be repeated in the following.

With reference to FIG. 7, in a light-emitting device 10*f*, the first fixing structure 300 extends from the first semiconductor layer 210 to a side surface of the third semiconductor layer 230 and/or a side surface of the second semiconductor layer 220. In the embodiment, the first fixing structure 300 partially overlaps the second opening O2 and partially covers the second electrode 244. In other embodiments, the first fixing structure 300 partially overlaps the first opening O1 and partially covers the first electrode 242.

Based on the above, increasing the area of the first fixing structure 300 covering the first light-emitting diode 200 can facilitate the fixing ability of the first fixing structure 300.

Figure 8:
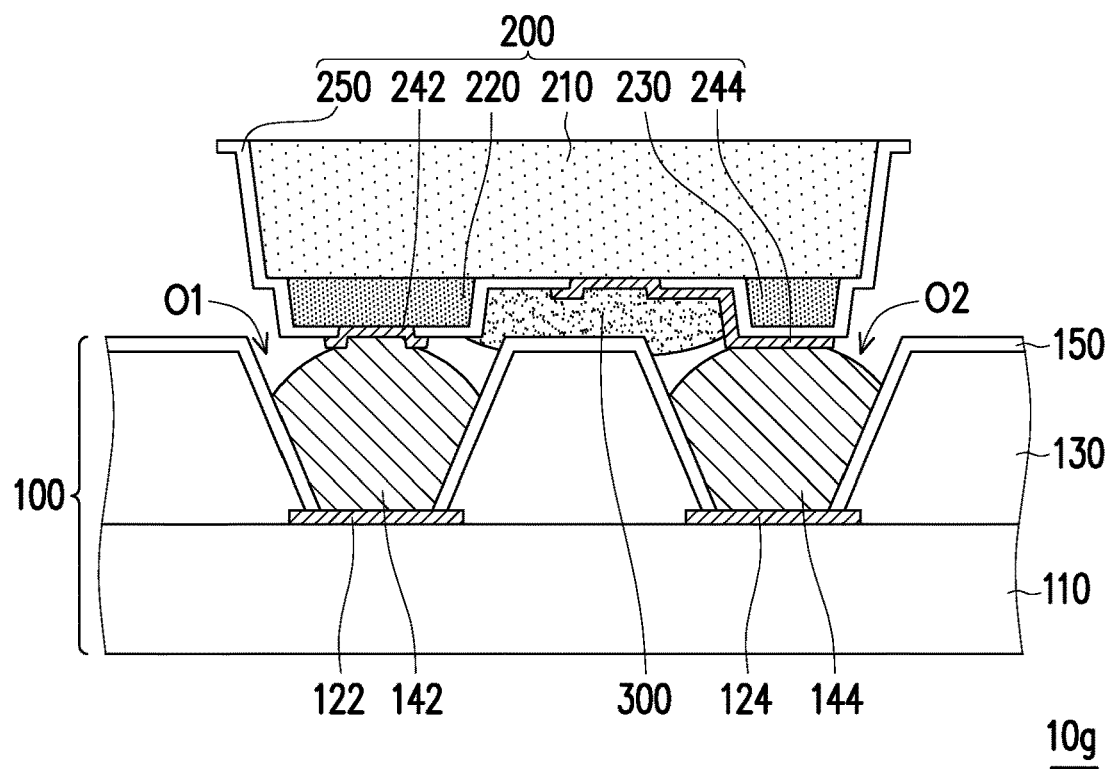
FIG. 8 is a schematic cross-sectional view of a light-emitting device according to an embodiment of the disclosure.

FIG. 8 is a schematic cross-sectional view of a light-emitting device according to an embodiment of the disclosure. It is noted that the embodiment in FIG. 8 incorporates the reference numerals/symbols and part of the content of the embodiment in FIG. 7. The same or similar reference numerals/symbols are used to represent the same or similar elements, and description of the same technical content is omitted. Reference is drawn the foregoing embodiments for the description of the omitted part, and the same content will not be repeated in the following.

With reference to FIG. 8, in a light-emitting device 10*g*, the first fixing structure 300 extends from the first semiconductor layer 210 to a side surface of the third semiconductor layer 230 and a side surface of the second semiconductor layer 220. In the embodiment, the first fixing structure 300 partially overlaps the first opening O1 and the second opening O2, and partially covers the second electrode 244.

Based on the above, increasing the area of the first fixing structure 300 covering the first light-emitting diode 200 can facilitate the fixing ability of the first fixing structure 300.

Figure 9:
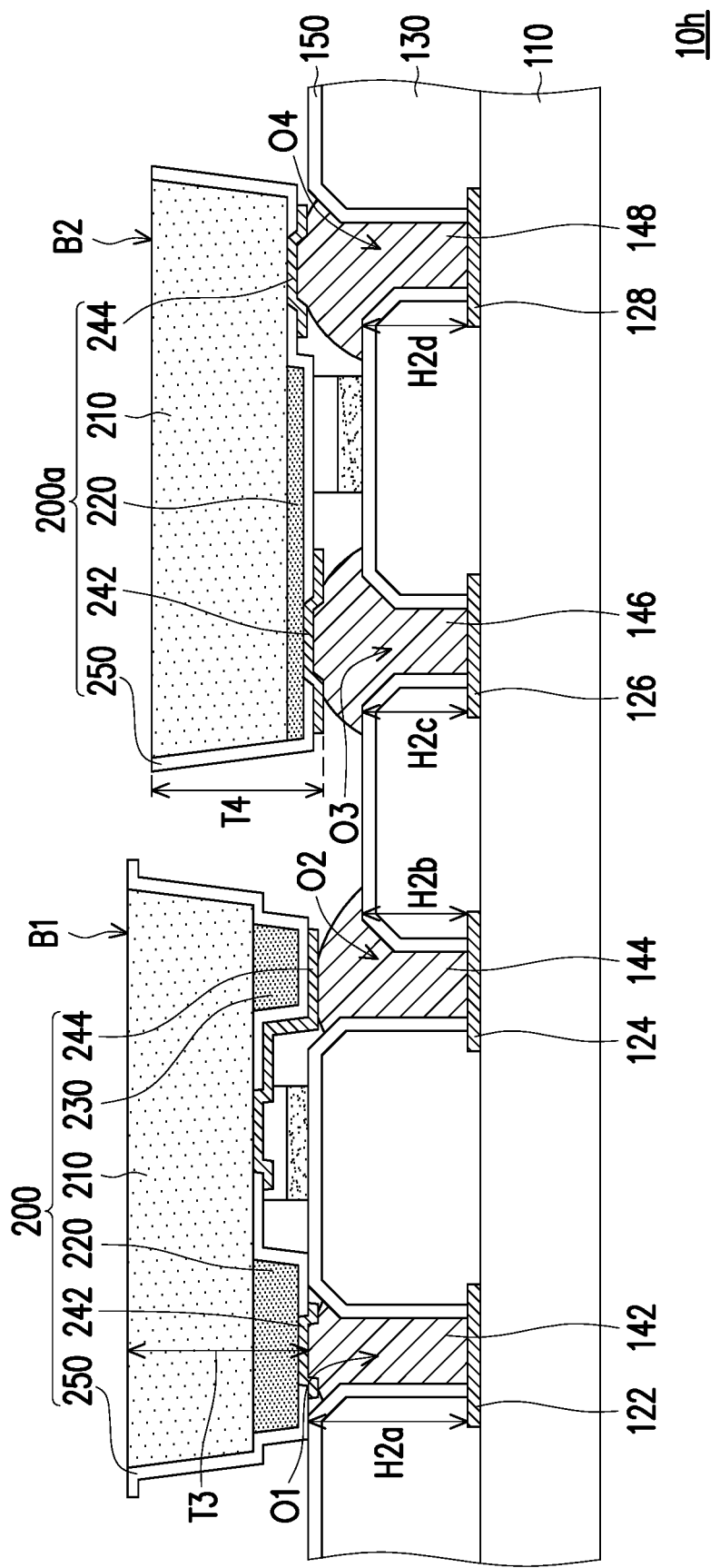
FIG. 9 is a schematic cross-sectional view of a light-emitting device according to an embodiment of the disclosure.

FIG. 9 is a schematic cross-sectional view of a light-emitting device according to an embodiment of the disclosure. It is noted that the embodiment in FIG. 9 incorporates the reference numerals/symbols and part of the content of the embodiment in FIG. 5. The same or similar reference numerals/symbols are used to represent the same or similar elements, and description of the same technical content is omitted. Reference is drawn the foregoing embodiments for the description of the omitted part, and the same content will not be repeated in the following.

With reference to FIG. 9, in a light-emitting device 10h, the first light-emitting diode 200 and the second light-emitting diode 200a are horizontal light-emitting diodes. The first light-emitting diode 200 and the second light-emitting diode 200a are bonded to the circuit substrate 100 in a flip chip manner. The first light-emitting diode 200 is in contact with the first electrical connection material 142 and the second electrical connection material 144, and the second light-emitting diode 200a is in contact with the third electrical connection material 146 and the fourth electrical connection material 148.

In the embodiment, the first light-emitting diode 200 and the second light-emitting diode 200a have different structures. For example, the first light-emitting diode 200 has the third semiconductor layer 230, and the second light-emitting diode 200a does not have the third semiconductor layer. The first electrode 242 of the first light-emitting diode 200 and the second electrode 244 of the second light-emitting diode 200a are located at the same or different horizontal level, and the first electrode 242 of the second light-emitting diode 200a and the second electrode 244 of the second light-emitting diode 200a are located at different horizontal levels.

In the embodiment, a thickness T3 of the first light-emitting diode 200 is different from a thickness T4 of the second light-emitting diode 200a. The thickness T3 of the first light-emitting diode 200 is greater than the thickness T4 of the second light-emitting diode 200a. A depth H2a of the first opening O1 is greater than a depth H2b of the second opening O2, a depth H2c of the third opening O3, and a depth H2d of the fourth opening O4. By adjusting the opening depths, a bottom surface B1 of the first light-emitting diode 200 and a bottom surface B2 of the second light-emitting diode 200a are located at different horizontal levels. Therefore, the pressures received by the first light-emitting diode 200 and the second light-emitting diode 200a during a hot pressing process are different. In some embodiments, the second light-emitting diode 200a (for example, a red light-emitting diode) contains materials that are easily damaged by pressure. As the bottom surface B1 of the first light-emitting diode 200 and the bottom surface B2 of the second light-emitting diode 200a are located at different horizontal levels, the second light-emitting diode 200a receives less force during the hot pressing process, which alleviates the damage to the second light-emitting diode 200a due to pressure. As a result, the process margin of the hot pressing process can be increased.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A light-emitting device, comprising:
   a circuit substrate, comprising:
      a substrate;
      a first pad and a second pad, located on the substrate;
      a flat layer, located on the substrate, and having a first opening overlapping the first pad and a second opening overlapping the second pad;
      a first electrical connection material, located in the first opening, and electrically connected to the first pad; and
      a second electrical connection material, located in the second opening, and electrically connected to the second pad;
   a first light-emitting diode, located on the flat layer, and in contact with the first electrical connection material and the second electrical connection material; and
   a first fixing structure, located between the first light-emitting diode and the flat layer, wherein a vertical projection of the first fixing structure on the substrate is located in a vertical projection of the first light-emitting diode on the substrate, and the first fixing structure is overlapping with a portion of the flat layer located between the first opening and the second opening, and the first fixing structure is in contact with the circuit substrate and the first light-emitting diode to support the first light-emitting diode.

2. The light-emitting device according to claim 1, wherein the first fixing structure comprises a first layer, and a second layer overlapping the first layer.

3. The light-emitting device according to claim 2, wherein a material of the first layer is different from a material of the second layer.

4. The light-emitting device according to claim 3, wherein at least one of the first layer and the second layer is a photoresist layer or a silicon oxide layer with a thickness of less than 1 μm.

5. The light-emitting device according to claim 1, wherein a thickness of the first fixing structure is 0.7 μm to 4 μm.

6. The light-emitting device according to claim 1, wherein a width of the flat layer between the first opening and the second opening is 1 μm to 60 μm, and a thickness of the flat layer is 1 μm to 4 μm.

7. The light-emitting device according to claim 1, wherein a depth of the first opening is different from a depth of the second opening.

8. The light-emitting device according to claim 1, wherein the circuit substrate further comprises:
   a third pad, located on the substrate, wherein the flat layer has a third opening overlapping the third pad; and
   a third electrical connection material, located in the third opening, and electrically connected to the third pad; wherein
   the light-emitting device further comprises:
      a second light-emitting diode, located on the flat layer, and in contact with the third electrical connection material, wherein a thickness of the first light-emitting diode is different from a thickness of the second light-emitting diode.

9. The light-emitting device according to claim 1, wherein the first fixing structure partially overlaps the first opening.

10. The light-emitting device according to claim 1, wherein a width of a first electrode of the first light-emitting diode is 1 μm to 20 μm.

11. The light-emitting device according to claim 1, wherein the first fixing structure partially covers a second electrode of the first light-emitting diode.

12. The light-emitting device according to claim 1, wherein a height of the first electrical connection material is 1 μm to 4 μm.

13. The light-emitting device according to claim 1, wherein a width of the first opening near the substrate is smaller than a width of a first electrode of the first light-emitting diode.

14. The light-emitting device according to claim 1, wherein the circuit substrate further comprises:
   a protective layer, located on a surface of the flat layer, and covering a sidewall of the first opening.

15. The light-emitting device according to claim 1, wherein a position of a vertical projection of a part of the first fixing structure on the substrate is located between a position of a vertical projection of a first electrode of the first light-emitting diode on the substrate, and a position of a vertical projection of a second electrode of the first light-emitting diode on the substrate.

\* \* \* \* \*